(12) United States Patent
Choi et al.

(10) Patent No.: US 9,733,684 B2
(45) Date of Patent: Aug. 15, 2017

(54) SYSTEM AND METHOD FOR CONTROLLING POWER CONSUMPTION

(71) Applicants: Inseok Stephen Choi, Redwood City, CA (US); Byoung Young Ahn, San Jose, CA (US); Yang Seok Ki, Palo Alto, CA (US)

(72) Inventors: Inseok Stephen Choi, Redwood City, CA (US); Byoung Young Ahn, San Jose, CA (US); Yang Seok Ki, Palo Alto, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/967,266

(22) Filed: Dec. 11, 2015

(65) Prior Publication Data

US 2017/0075401 A1   Mar. 16, 2017

Related U.S. Application Data

(60) Provisional application No. 62/218,527, filed on Sep. 14, 2015.

(51) Int. Cl.
| *G06F 1/26* | (2006.01) |
| *G11C 11/406* | (2006.01) |
| *G11C 14/00* | (2006.01) |
| *G11C 16/30* | (2006.01) |

(52) U.S. Cl.
CPC .......... *G06F 1/26* (2013.01); *G11C 11/40615* (2013.01); *G11C 14/0009* (2013.01); *G11C 16/30* (2013.01)

(58) Field of Classification Search
CPC ... G06F 1/26; G06F 1/32; G06F 1/324; G06F 1/3287
USPC ........................................................ 713/300
See application file for complete search history.

(56) References Cited

U.S. PATENT DOCUMENTS

| 8,826,051 B2 * | 9/2014 | Wakrat .................. G06F 1/3203 713/300 |
| 2007/0245161 A1 * | 10/2007 | Shaw ..................... G06F 1/3203 713/300 |
| 2008/0104430 A1 * | 5/2008 | Malone ................. G06F 1/3203 713/300 |
| 2011/0047316 A1 | 2/2011 | Farhan et al. |
| 2012/0010758 A1 * | 1/2012 | Francino ................ G05B 17/02 700/291 |
| 2012/0017099 A1 * | 1/2012 | David ................... G06F 1/3203 713/300 |
| 2012/0023351 A1 * | 1/2012 | Wakrat .................. G06F 1/3203 713/322 |
| 2012/0173888 A1 * | 7/2012 | Srebranig ............. G06F 1/3287 713/300 |
| 2013/0097433 A1 | 4/2013 | Boorman et al. |

(Continued)

*Primary Examiner* — Vincent Tran
(74) *Attorney, Agent, or Firm* — Renaissance IP Law Group LLP

(57) ABSTRACT

An embodiment includes a system, comprising: a processor; a plurality of memories; and a control circuit coupled to the processor and the memories, and configured to: receive a power limit; measure a power consumption of the processor and the memories; and iteratively change a plurality of operating parameters of the processor and the memories to optimize an objective function associated with the system to operating states where the power consumption is less than or equal to the power limit.

18 Claims, 9 Drawing Sheets

(56) References Cited

U.S. PATENT DOCUMENTS

| | | |
|---|---|---|
| 2013/0332753 A1* | 12/2013 | Varma .................. G06F 1/26 |
| | | 713/300 |
| 2014/0173242 A1 | 6/2014 | Huffman et al. |
| 2014/0208136 A1* | 7/2014 | Rahardjo .............. G06F 1/26 |
| | | 713/320 |
| 2014/0281600 A1 | 9/2014 | Wells |
| 2016/0179164 A1* | 6/2016 | Park .................... G06F 1/324 |
| | | 713/322 |
| 2017/0075610 A1 | 3/2017 | Choi et al. |
| 2017/0084344 A1 | 3/2017 | Choi et al. |

* cited by examiner

SYSTEM AND METHOD FOR CONTROLLING POWER CONSUMPTION

CROSS-REFERENCE TO RELATED APPLICATIONS

This application claims the benefit of U.S. Provisional Patent Application No. 62/218,527, filed Sep. 14, 2015, the contents of which is hereby incorporated by reference herein, in its entirety, for all purposes.

BACKGROUND

This disclosure relates to controlling power consumption in systems and, in particular, controlling power consumption in storage systems.

Power consumption of devices is becoming a metric for commercial and consumer markets. For example, in a commercial data center, cooling costs can take up to one third of the total cost. In addition, modern data center servers have begun to adopt high performance solid state drives (SSD), such as NVM Express (NVMe) devices. NVMe devices commonly include higher-performance CPUs and large dynamic random access memories (DRAM) to provide higher performance compared to other SSDs. Such high-performance devices can consume more power, which may become a significant amount of power consumption even in a data center configuration. Similarly, consumer mobile devices, such as laptops, have begun to adopt higher performance SSDs. Power consumption similarly becomes a factor when the mobile device is unplugged.

SSDs may include a maximum thermal design power (TDP). However, the TDP is a specification for maximum power consumption that is set during design to prevent damage to the device. If TDP is exceeded, performance is throttled to remain under the TDP.

SUMMARY

An embodiment includes a system, comprising: a processor; a plurality of memories; and a control circuit coupled to the processor and the memories, and configured to: receive a power limit; measure a power consumption of the processor and the memories; and iteratively change a plurality of operating parameters of the processor and the memories to optimize an objective function associated with the system to operating states where the power consumption is less than or equal to the power limit.

An embodiment includes a method, comprising: receiving a power limit in a control circuit; measuring, by a control circuit, a power consumption of a processor and a plurality of memories; and iteratively changing, by the control circuit, a plurality of operating parameters of the processor and the memories to optimize an objective function associated with the processor and memories to operating states where the power consumption is less than or equal to the power limit.

An embodiment includes a system, comprising: a plurality of devices; and a control circuit coupled to the devices, and configured to: receive a power limit; measure a power consumption of the devices; and iteratively change a plurality of operating parameters of the devices to optimize an objective function associated with the system to operating states where the power consumption is less than or equal to the power limit.

DETAILED DESCRIPTION

Figure 1A:
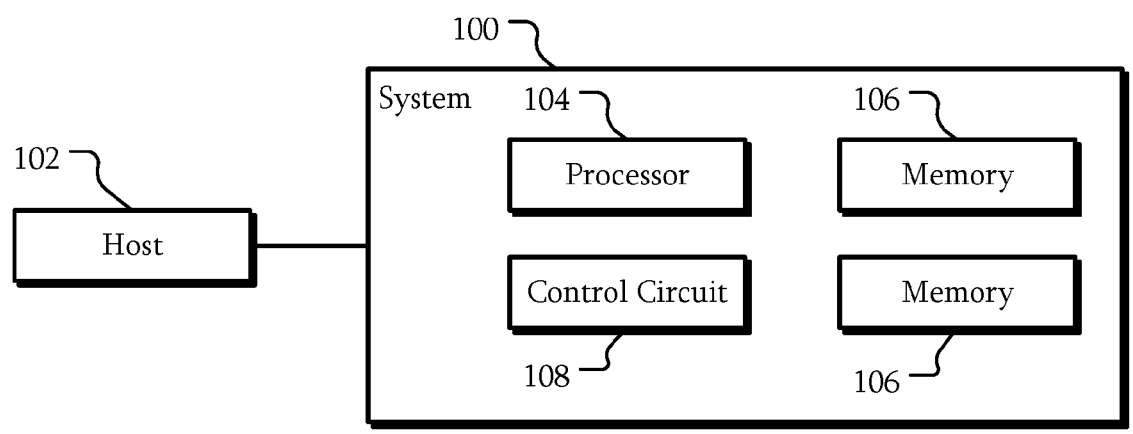
FIG. 1A is a schematic view of a system according to an embodiment.

The embodiments relate to controlling power consumption in systems. The following description is presented to enable one of ordinary skill in the art to make and use the embodiments and is provided in the context of a patent application and its requirements. Various modifications to the embodiments and the generic principles and features described herein will be readily apparent. The embodiments are mainly described in terms of particular methods and systems provided in particular implementations.

However, the methods and systems will operate effectively in other implementations. Phrases such as "an embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of this disclosure. The embodiments will also be described in the context of particular methods having certain steps. However, the method and system may operate according to other methods having different and/or additional steps and steps in different orders that are not inconsistent with the embodiments. Thus, embodiments are not intended to be limited to the particular embodiments shown, but are to be accorded the widest scope consistent with the principles and features described herein.

The embodiments are described in the context of particular systems having certain components. One of ordinary skill in the art will readily recognize that embodiments are consistent with the use of systems having other and/or additional components and/or other features. However, one of ordinary skill in the art will readily recognize that the methods and systems are consistent with other structures. Methods and systems may also be described in the context of single elements. However, one of ordinary skill in the art will readily recognize that the methods and systems are consistent with the use of memory system architectures having multiple elements.

It will be understood by those skilled in the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. Furthermore, in those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

FIG. 1A is a schematic view of a system according to an example embodiment. In this embodiment, a system 100 is coupled to a host 102. The system 100 includes a processor 104, multiple memories 106, and a control circuit 108.

In some embodiments, the system 100 may include a storage system. For example, a storage system may be configured to be coupled to the host 102 through a communication interface such as serial attached SCSI (SAS), serial ATA (SATA), NVM Express (NVMe), Fiber channel, Ethernet, remote direct memory access (RDMA), or the like. However, in other embodiments, the system 100 may be different from a storage system. As will be described herein, the system 100 may be any system having components that have multiple operating parameters that affect power consumption and at least another aspect of the system.

The processor 104 may be a general purpose processor, a digital signal processor (DSP), an application specific integrated circuit, a microcontroller, a programmable logic device, discrete circuits, a combination of such devices, or the like. The processor 104 may include internal portions, such as registers, cache memory, processing cores, or the like, and may also include external interfaces, such as address and data bus interfaces, interrupt interfaces, or the like. Although only one processor 104 is illustrated, multiple processors may be present. In addition, other interface devices, such as logic chipsets, hubs, memory controllers, communication interfaces, or the like may be part of the system 100 to connect the processor 104 to internal and external components.

The memories 106 may be any device capable of storing data. Here, two memories 106 are illustrated; however, any number of memories 106 greater than one may be included in the system 100. Examples of the memories 106 include a dynamic random access memory (DRAM) module, a double data rate synchronous dynamic random access memory (DDR SDRAM) according to various standards such as DDR, DDR2, DDR3, DDR4, static random access memory (SRAM), non-volatile memory such as Flash, spin-transfer torque magentoresistive random access memory (STT-MRAM), or Phase-Change RAM, or the like.

The control circuit 108 is circuitry that is coupled to the processor 104 and the memories 106. The control circuit may include a general purpose processor, a digital signal processor (DSP), an application specific integrated circuit, a microcontroller, a programmable logic device, discrete circuits, or the like similar to the processor 104. As will be described in further detail below, the control circuit may be implemented in the processor 104; however, in this embodiment, the control circuit 108 is separate from the processor 104.

The control circuit 108 may include circuitry to interface with the processor 104 and memories 106. For example, the control circuit 108 may be coupled to a common bus with the processor 104 and memories 106. In other embodiments, the control circuit 108 may include inputs and outputs connected to corresponding inputs and outputs of the processor 104 and memories 106, connected to intervening devices, or the like. For example, the control circuit 108 may be configured to control one or more voltage regulators configured to supply a power voltage to one or more of the processor 104 and memories 106. In another example, the control circuit 108 may include an interface to a corresponding communication interface of the processor 104 and memories 106, such as an I2C interface. In yet another example, the control circuit 108 may be directly connected to inputs and outputs of the processor 104 and memories 106.

Regardless, the control circuit 108 may be configured to interact with the processor 104 and/or memories 106. In particular, the control circuit 108 may be configured to receive power information from the processor 104 and memories 106 and affect multiple operating parameters of the processor 104 and memories 106. For example, the control circuit 108 may be configured to measure a power consumption of the processor 104 and/or memories 106. In addition, the control circuit 108 may be configured to iteratively change a plurality of operating parameters of the processor and the memories to optimize an objective function associated with the system to operating states where the power consumption is less than or equal to a power limit.

Figure 1B:
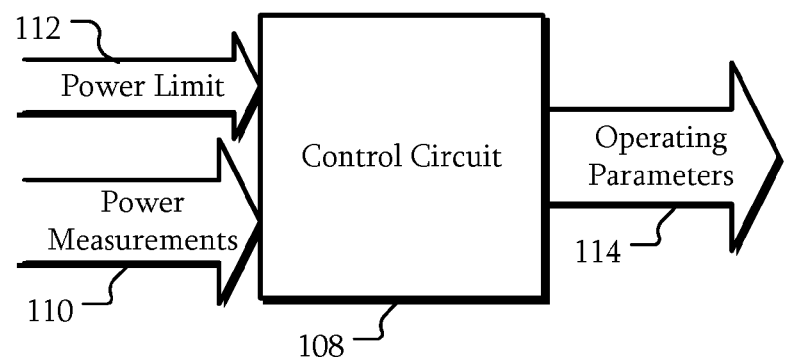
FIG. 1B is a schematic view of a control circuit according to an embodiment.

FIG. 1B is a schematic view of a control circuit according to an example embodiment. Referring to FIGS. 1A and 1B, in this embodiment, the control circuit 108 is configured to receive power measurements 110. The power measurements 110 represent measurements of power consumption of the processor 104 and/or memories 106. For example, the power measurements 110 may include measurements of power consumption for the processor 104 and each of the memories 106. The control circuit 108 may receive the power measurements in a variety of ways. For example, the control circuit 108 may use a communication interface, direct connections to the processor 104 and memories 106, or the like to read a power, temperature, current, and/or voltage meter of the processor 104 and memories 106. In another example, the control circuit 108 may include an arithmetic logic unit or other circuitry configured to calculate an estimate of a power consumption of one or more of the processor 104 and memories 106.

The control circuit 108 is also configured to receive a power limit 112. For example, if the control circuit 108 includes a separate microcontroller, the microcontroller may receive a communication that indicates a particular power level through a communication bus. Such a communication may be received from the processor 104, from a device external to the system 100, or the like. However, the power limit 112 may be received in other ways depending on the particular circuitry of the control circuit 108. In an embodiment, the software executing on the host 102 may be configured to issue a system call, such as an IOCTL call, or other call exposed through an API associated with the system 100. Through such a call, the host 102 may transmit a command including the power limit. For example, a command may include a value for the power limit. In another example, the command may include a set of rules, a schedule, or the like associating time or clock information with a power budget or limit. In addition, objective functions and/or other meta may also be included in the command. In a particular embodiment, a command may include multiple entries with each entry including a time, a power limit, and an objective function. Accordingly, the host 102 may control the power limit of the system 100, establish rules or a schedule for the system 100 to follow, set objective functions, or the like.

The control circuit 108 is configured to output operating parameters 114. The operating parameters 114 represent parameters of the processor 104 and/or memories 106 that may be changed to change the operation of the processor 104 and/or memories 106. For example, operating parameters may include any parameter of the processor 104 and memories 106 that may be controlled to affect performance and/or power consumption. In a particular example, the control circuit 108 may be configured to write to a register of the processor 104 and/or memories 106. In another example, the control circuit 108 may transmit a control signal to a voltage regulator to cause the voltage regulator to output a different voltage to one or more of the processor 104 and memories 106.

As described above, the control circuit 108 may be configured to iteratively change multiple operating parameters of the processor 104 and the memories 106 to optimize an objective function. In particular, this optimization may be performed such that operation of the system 100 using the optimized state of the operating parameters less than or equal to the power limit 112. This optimization may be performed at run time. Accordingly, the objective function may be optimized within the constraint of a particular power budget.

The objective function may represent a variety of conditions to be optimized. For example, the objective function may represent a performance of the system 100, an endurance of the system 100, a reliability of the system 100, or the like. In other examples, the objective function may represent a number of inputs and outputs, a bandwidth, a latency, a capacity, or other aspects of the system 100. The objective function may represent an aspect of less than all of the system 100. For example, the objective function may represent a performance or other aspect of just the memories 106. Any metric of the system 100 may be used as or as part of the objective function.

In an example embodiment, the operating parameters may include at least one operating parameter of the processor, at least one operating parameter of a first memory of the memories, and at least one operating parameter of a second memory of the memories. That is, the operating parameters include operating parameters from the processor 104 and each of the memories 106. As a result, the operating state of the processor 104 and each of the memories 106 may be changed to affect the objective function and the power consumption. However, in other embodiments, operating parameters of less than all of the processor 104 and the memories 106 may be used for iteration. For example, in some embodiments, operating parameters of the processor 104 and less than all of the memories 106 may be iterated. In other embodiments, the processor 104 and each of the memories 106 may each have multiple operating parameters that may be iterated.

Regardless, multiple operating parameters may be iterated. In particular, since multiple and possibly many operating parameters may be changed, finding a solution may be difficult. In particular, finding the solution may be NP-hard. Accordingly, the operating parameters may be iteratively changed to achieve a substantially optimal solution within a shorter time. That is, while in some embodiments, the operating state may be the optimal state, in other embodiments, the operating state may not be the optimal state for a given objective function; however, the operating state was achieved within a smaller amount of time and may be found at run-time. Because of the lower time to find an optimal solution, in some embodiments, the system 100 may respond to varying power limits 112 during operation and within those power limits 112, the objective function may be optimized.

In a particular example, a power limit 112 may be set to 10 W. A lower parallelism, such as a fewer number of active processors 104 or smaller sizes of the memories 106, may achieve the lower power limit 112. In addition, a different operating state of the memories 106, such as single level cell (SLC) programming, may also achieve the power limit 112. The objective function may indicate which technique should be used. For example, if the objective function is for best performance, the SLC programming configuration may be used, reducing capacity. However, the number of active processors 104 or other aspects of the memories 106 may not be changed to reduce parallelism and thus, performance may not be reduced. In another example, the objective function may indicate a higher capacity and thus, the lower parallelism configuration may be used.

In some embodiments, the objective function may not indicate a particular technique to use or specify a particular operating parameter or parameters that may be changed. Using one of the examples above, the objective function need not specify that SLC programming should be used. In contrast, the objective function may merely indicate that performance should be maximized within the power limit 112. Through iteration of the operating parameters, including an operating parameter indicating the particular cell level programming technique to be used, an optimum performance within the power limit 112 may be achieved. While in some instances, the operating parameters may indicate that SLC programming should be used, in other instances a sufficient amount of power may be saved by changing other operating parameters without changing to SLC programming, while still maximizing the performance.

In a particular embodiment, the control circuit 108 may be configured to receive a second, different power limit 112 after operating with a first power limit 112. The control circuit 108 may then be configured to iteratively change the operating parameters of the processor 104 and the memories 106 to optimize the objective function associated with the system to operating states where the power consumption is less than or equal to the second power limit.

In an embodiment, the optimization of the objective function may be performed at run-time. That is, the control circuit 108 may be configured to iterate the operating parameters 114 while the system 100 is running. When a new power limit 112 is received, the control circuit 108 may be configured to iterate the operating parameters to change the operating state of the system 100 to both be within the new power limit 112 and optimize the objective function again, while the system 100 is running. Accordingly, at run-time, the power limit 112 may be dynamically changed and, in response, the operation of the system may be changed to meet the new power limit 112.

In some embodiments, the control circuit 108 may be configured to continuously iterate the operating parameters. For example, the control circuit 108 may be configured to perform an optimization sequence periodically, such as every millisecond. That is, the control circuit 108 may be configured to iterate the operating parameters to find an optimal state every millisecond. Although a millisecond has been used as an example, other time frames may be used as desired. For example, if an expected time to find an optimal solution is 10 ms, the optimization sequence may be repeated every 20 ms. Accordingly, when a new power limit 112 is set, the control circuit 108 may continue to iterate, but with the new power limit 112.

In other embodiments, the control circuit 108 may be configured to iterate in response to particular conditions. For example, the control circuit 108 may be configured to begin iterating on startup, after returning from a sleep state, after receiving a new power limit 112, after a particular time period, or the like.

In some embodiments, the effect of the power limit 112 may be reduced if not eliminated. For example, the system 100 may operate in a condition where the power limit 112 is either not present or set to a value higher than the system 100 will likely ever achieve. Accordingly, the optimization described herein may not be bounded by a power limit 112. As a result, the objective function may be optimized using the operating parameters alone. Operating parameters may be iterated across the full range of those operating parameters. In a particular example, the objective function may be associated with maximizing longevity without regard for power consumption. The resulting set of operating parameters may be different from a set of operating parameters that may optimize performance without regard to power consumption. While optimizing longevity has been used as an example of an objective function that may be optimized without regard for power consumption, any objective function may be used.

FIGS. 2A-F are schematic views of iterations according to various embodiments. In some embodiments, different iterative methods may be used to iterate the operating parameters. Examples of iterative methods that may be used include a Nelder-Mead method and a coordinate descent method; however, in other embodiments, other iterative methods may be used. A Nelder-Mead method will be used as an example. The Nelder-Mead method is an iterative method that may converge relatively quickly. In some embodiments, because of being heuristic, the Nelder-Mead method may not always provide an optimum set of operating parameters, but the operating parameters it does provide may be a good enough solution, obtained in relatively short period of time.

The Nelder-Mead method starts with initial simplex with n+1 vertices, where n is the number of operating parameters. The vertices represent a set of operating parameters. The method then iterates steps according to the intermediate search vertices. At the beginning of a search, initial sets of operating parameters can be partially based on previous optimal solution to reduce the time required to converge, however, in other embodiments, new and/or random sets of operating parameters may be added to avoid local optima. In one embodiment, one set may be initialized to a previous optimal solution and the other sets may be initialized to random sets. In another embodiment, two or more sets may be initialized to previous optimal solutions while the remaining sets are set to random sets.

Figure 2A:
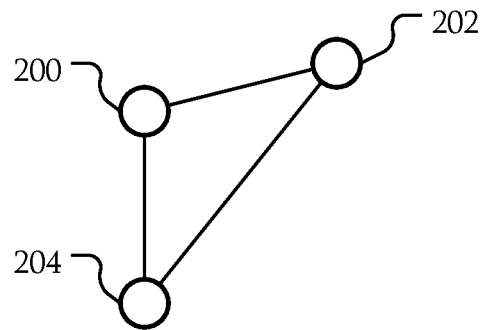
FIGS. 2A-F are schematic views of iterations according to various embodiments.

Referring to FIG. 2A, optimization using two operating parameters will be used as an example; however, any number of operating parameters may be optimized. As two operating parameters are to be optimized, the objective function is calculated for three sets 200, 202, and 204 of operating parameters. In addition to calculating a result of the objective function, the power consumption may be measured for the three sets 200, 202, and 204.

Figure 2B:
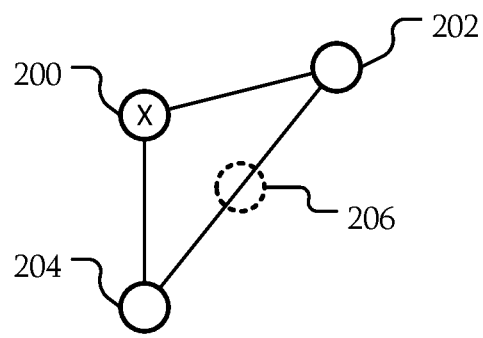
Figure 2C:
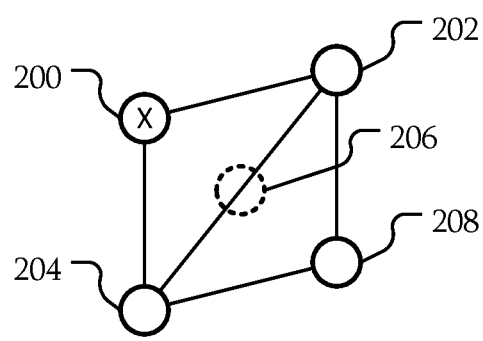

In FIG. 2B, a worst set is found. Here, the worst set is set 200. A center of gravity 206 of the remaining sets 202 and 204 may be calculated. In FIG. 2C, the worst set 200 may be reflected about the center of gravity 206 to generate a new set 208. The objective function may be calculated for the new set 208 and a new power consumption may be measured.

Figure 2D:
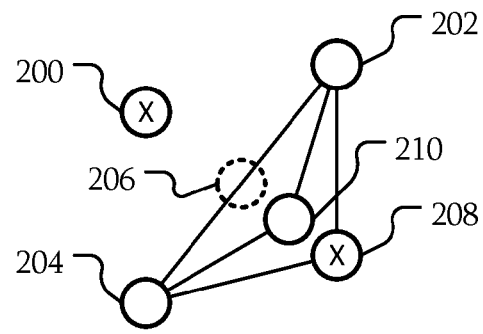
Figure 2E:
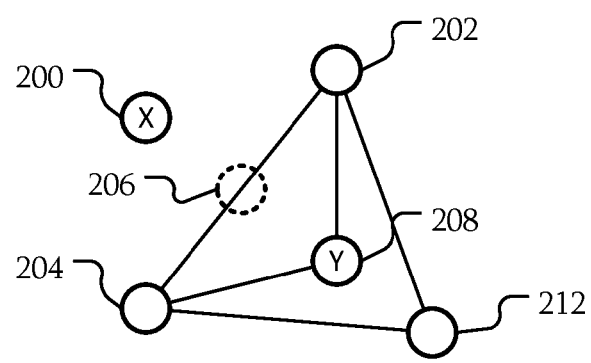

In FIG. 2D, the new set 208 may be the worst set. If so, a new set 210 may be generated that is closer to the center of gravity 206. Again, the objective function may be calculated for the new set 210 and a new power consumption may be measured. Alternatively, in FIG. 2E, if the new set 208 has a more optimal result from the objective function, a new set 212 may be generated in the opposite direction from the center of gravity 206. Again, the objective function may be calculated for the new set 212 and a new power consumption may be measured.

Figure 2F:
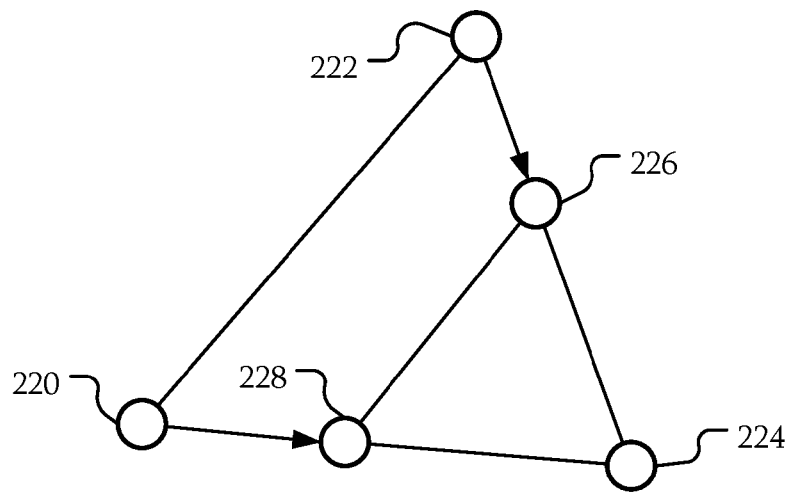

In FIG. 2F, an initial group of sets 220, 222, and 224 may be generated, the objective function may be calculated for the sets 220, 222, and 224, and new power consumptions may be measured. Here, sets 220 and 222 may have less optimal results from the objective function than that of set 224. Accordingly, new sets 226 and 228 may be generated that are closer to set 224. Again, the objective function may be calculated for the sets 226 and 228 and new power consumptions may be measured.

Although particular techniques of selecting new sets have been described above, other techniques may be used and in different orders. The above examples are merely to illustrate examples of iterations of the operating parameters.

In addition, while results from the objective function have been used in determining whether to use or discard a particular set, the power measurement for those sets may also be used. For example, if the power measurement for a particular set is greater than the current power limit, that set may be treated as a worst set. In another example, if all of the sets have power measurements greater than the current power limit, the power measurements may be used instead of results of the objective function to determine a new set of operating parameters. That is, the set with the highest power measurement may be the set that is replaced with a new set.

In another embodiment, the control circuit 108 may be configured with predetermined operating parameters for various power limits. While these predetermined operating parameters may result in power consumption that is below the associated power limit, the predetermined operating parameters may not be optimal operating parameters for a given objective function. Accordingly, the predetermined operating parameters may be used as a starting point for iteration to optimize the objective function within the power limit.

Referring back to FIGS. 1A and 1B, in an embodiment, the processor 104 may be configured to receive a command related to the iteration. For example, the host 102 may transmit a command to the processor 104. The command may be associated with a variety of operations of the system 100 related to power consumption and the optimization described herein. The command may indicate an iterative method to use when iteratively changing the operating parameters.

In another example, the command may indicate the objective function to be optimized. In an embodiment, after an optimum state of the operating parameters has been found, the objective function may be changed in response to the command. The iteration may continue with the new objective function. Accordingly, even with the same power limit 112, the operating parameters may be changed to a different optimal state due to the change in the objective function.

In yet another example, the command may include the power limit 112 described above. Any aspect related to the iteration may be received in a command. However, in some embodiments, some aspects, such as the iterative method, the objective function, or the like may be predetermined.

Although the host 102 transmitting a command to the processor 104 has been used as an example, in other embodiments, the command may be communicated in different ways. For example, the system 100 may present an interface to the control circuit 108 to the host 102. As a result, the host 102 may more directly communicate the command to the control circuit 108.

Figure 3:
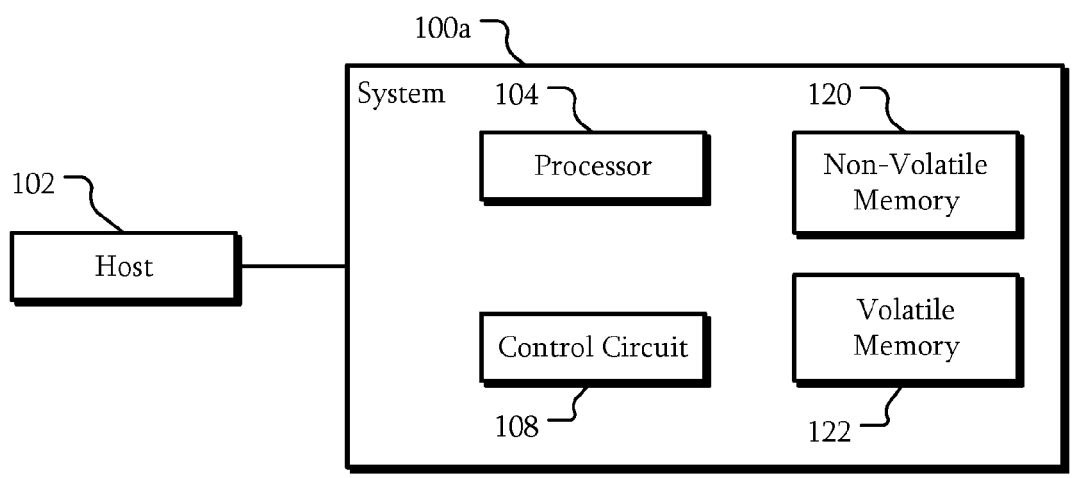
FIG. 3 is a schematic view of a system with volatile and non-volatile memory according to another embodiment.

FIG. 3 is a schematic view of a system with volatile and non-volatile memory according to another embodiment. In this embodiment, the system 100a may be similar to the system 100 of FIG. 1A. However, the memories 106 include a non-volatile memory 120 and a volatile memory 122. In a particular embodiment, the system 100a may operate as an SSD where the non-volatile memory 120 is the mass storage medium.

In an embodiment, the volatile memory 122 may include a dynamic random access memory (DRAM). The DRAM may have operating parameters such as a power gating parameter, a self-refresh parameter, a number of ranks, and a number of channels. Each of these may have an effect on both the DRAM's contribution to the objective function result and the power consumption.

The non-volatile memory 120 may include a non-volatile random access memory (NVRAM) such as a NAND flash memory, spin-transfer torque magnetic RAM, phase-change memory (PCM), or the like. The NVRAM may have operating parameters such as a read retry parameter, a single-level/multi-level cell mode switch, an erase voltage, and a programming voltage.

In particular, NAND flash media has asymmetric latency and power consumption characteristics. NAND cells may take longer in writing (programming)/erasure than in reading. In addition, a read uses a lower voltage operation (for example, 5V), but programming or its erasure require higher voltage (for example, 20V for programming and −20V for erasing). Moreover, unlike a sensing procedure over each NAND cell in reading, programming or erasing requires injection or removal of charge to/from floating gate. Fowler-Nordheim (FN) tunneling takes longer and, as a result, programming and erasure may be slower than reading in orders of magnitude.

NAND flash media may use multi-level cells (MLC) storing multi states per NAND cell. Due to the higher information density per memory cell, MLC provides larger logical capacity in a given memory. However, MLC introduces a complex read/program/erase mechanism. MLC programming consists of two phases; LSB (least significant bit) and MSB (most significant bit) programming. Programming utilizes ISPP (Incremental Step Pulse Programming) for fine control in threshold voltages by injecting charge incrementally with step sizes. Moreover, MLC NAND introduces another asymmetric characteristic: MSB programming takes much longer than LSB programming due to more threshold levels (3 compared to 1 in SLC) and thus finer control is used to set threshold voltages properly. MSB programming may be ten times slower than LSB programming in many NAND chips.

FN tunneling enables the representation of logical "1" and "0" by shifting threshold voltage Vth. It is proportional to the store electro charge, Q. Therefore, once a proper charge is injected/dejected into/from floating gates, it is possible to define the logical status of given cell. The amounts of charge in floating gate determine the Vth and thus, reading Vth can be configured or programmed.

However, Cell Vth degradation may occur due to the charge trap inside the oxide between the floating gate and the substrate. As a result, charges inside the oxide prevent proper charge injection and dejection. As a consequence, measured Vth from the control gate is higher at both states. Thus, with an intelligent program/erase mechanism, erase/program operations may take longer as each cell degrades.

In addition to these asymmetric characteristics, NAND media and its organization may introduce parallelism to hide NAND's higher latency in programming and erasing and such parallelism includes multi-plane, interleave, and multi-channel operations. Due to this parallelism, meaning that multiple NAND operation can be executed simultaneously, heterogeneous parallelism can be applied to meet power constraints.

A variety of different characteristics of a non-volatile memory 120 has been described above. Each of these characteristics may be configurable. A non-volatile memory 120 may have a variety of operating parameters related to the above described operations.

The processor 104 may have a variety of operating parameters. For example, the operating parameters may include a dynamic voltage and frequency scaling (DVFS) parameter and a power gating parameter of the processor. In another example, the processor 104 may have multiple cores. In yet another example, multiple processors 104 may be present with a number of active processors 104 being variable.

In a particular example, the processor 104 may be operable at a variety of supply voltages. The supply voltage may be a first operating parameter. The processor 104 may include multiple cores, each of which may be enabled or disabled. The number of operating cores may be a second operating parameter. The volatile memory 122 may include a number of ranks that may be enabled or disabled and a variable supply voltage, resulting in two additional operating parameters. The non-volatile memory 120 may be operable in either a single-level cell mode or a multi-level cell mode. The non-volatile memory 120 may also include a variable programming voltage. The cell mode and the programming voltage may be two additional operating parameters.

As described above, for a given power limit, the operating parameters may be iterated to optimize an objective function. An example of a solution includes a processor 104 supply voltage of 1.35V, two of four processor 104 cores being enabled, 10 ranks out of sixteen ranks of the volatile memory 122 being enabled, a 1.1V volatile memory 122 supply voltage, a single level cell mode for the non-volatile memory 120, and a 10V programming voltage for the non-volatile memory 120.

In a particular embodiment, the system 100 may be an SSD including multiple processors 104, multiple non-volatile memories 120, and multiple volatile memories 122. The processors 104 may consume a greater portion of the total power consumption of high-performance SSDs, therefore, the processors 104 may be considered as a candidate to reduce its power consumption. Similarly DRAMs and NVM media can be independent candidates for power reduction. These components may operate in conjunction to provide high performance while hiding slower write characteristic and FTL overhead of the non-volatile memories 120. Such a system may be relatively complex and thus, predicting a performance impact may be relatively hard when controlling each component. As a result, the way to change the operating parameters of the component or components in a manner that will result in best power saving while showing least performance degradation may not be readily apparent. Due to the complexity of SSDs, solving such a problem may be difficult and time consuming. Iterating the operating parameters as described herein may allow for a more optimal solution within an acceptable time frame.

In an embodiment, the control circuit 108 may be configured to identify an operating parameter having a state that has remained constant among at least two consecutive optimization sequences and remove the identified operating parameter from the operating parameters for at least one future optimization sequence. For example, the control circuit 108 may include a memory configured to store result from previous optimization sequences, i.e., the states of the operating parameters for an optimized solution.

Over multiple optimization cycles, multiple optimal solutions may be found and stored in the memory. Table 1 below lists states of operating parameters for three example optimization solutions, each of which was the optimum result after an optimization sequence.

TABLE 1

| Processor Voltage | Number of Processors | Memory Ranks | Volatile Memory Voltage | Non-volatile Memory Voltage |
|---|---|---|---|---|
| 1.35 | 3 | 10 | 1.1 | 10 |
| 1.2 | 4 | 10 | 1.2 | 8 |
| 1.1 | 5 | 10 | 1.1 | 7 |

In this example, the number of memory ranks in each of the optimization solutions after each of the optimization sequences is the same. The memory ranks may be identified as an operating parameter that has remained constant. As a result of identifying the memory ranks as an operating parameter that has remained constant, the memory ranks may be removed from the group of operating parameters that are iterated for at least some future iterations. In this example, the new operating parameter set is reduced to 4 operating parameters from 5. As a result, further optimization may reach optimization solutions faster due to the reduced dimension. While these particular operating parameters have been used as examples, any operating parameters may be analyzed to determine if one or more have remained constant for a sufficient amount of optimization cycles to be a candidate for removal.

In an embodiment, the control circuit 108 may be capable of setting the various operating parameters to discrete values. The control circuit 108 may be configured to write a discrete value to a register, communicate the discrete value to another component, or the like to set the operating parameter. For example, the number of ranks may be settable only to integers. In another example, the processor voltage may be settable to non-integer values, but only in discrete steps within a range. Accordingly, an operating parameter may be determined to be constant by the control circuit 108 if the discrete value has not changed.

In an embodiment, the control circuit 108 may be configured to restore the removed operating parameters to the set of operating parameters. For example, if a power limit is changed, a predetermined amount of time has passed, usage of the system 100*a* has changed, or the like, the removed parameters may be returned by setting a flag in a memory of the control circuit 108 indicating which operating parameter are to be iterated. Any event that may change an operation of the system 100*a* may be used as a trigger to return the removed operating parameters.

Figure 4:
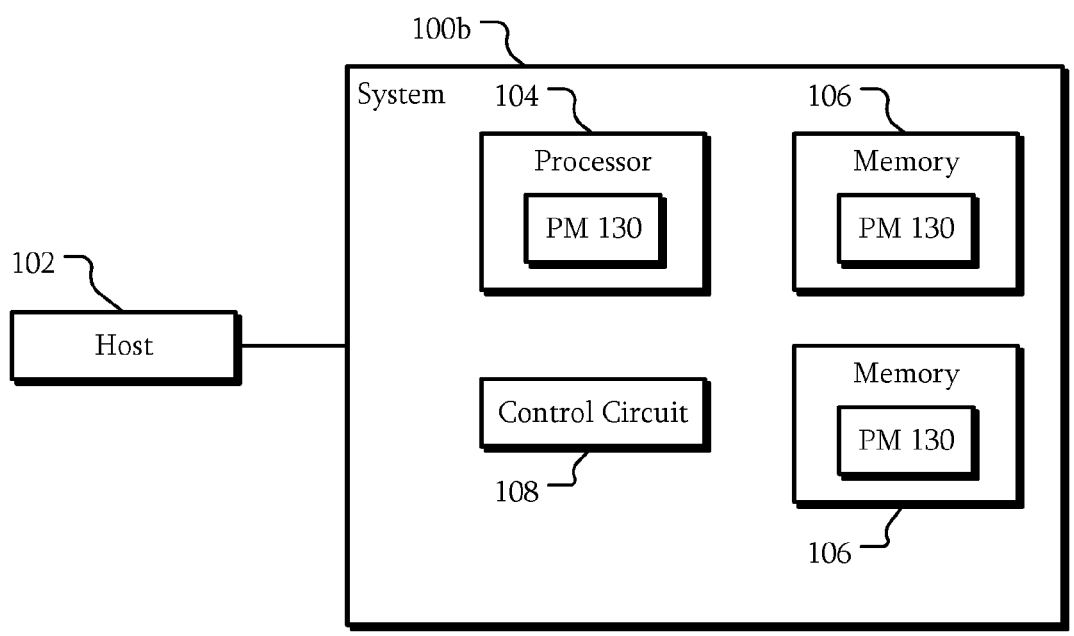
FIG. 4 is a schematic view of a system with power meters according to another embodiment.

FIG. 4 is a schematic view of a system with power meters according to another embodiment. In an embodiment, at least one of the processor 104 and the memories 106 includes a power meter circuit 130 configured to measure power. In this embodiment, each of the processor 104 and the memories 106 includes a power meter circuit 130.

The power meter circuit 130 may take a variety of forms. For example, a thermal sensor or power sensor may be present in the particular device. Amplifiers, analog to digital converters, buffers, registers, or the like may be part of the power meter circuit 130 to convert the physical effect into a digitized value that may be used by the control circuit 108. For example, a signal may be sensed from a sensor, digitized, and stored in a register. The register may be read by the control circuit 108, read by the processor 104 and communicated to the control circuit 108, or the like to read the power from the power meter circuit 130.

The readings from these power meter circuits 130 may be normalized and combined into a power consumption value. Accordingly, when operating, the control circuit 108 may receive a power measurement for a current set of operating parameters. When a new set of operating parameters are used, another power measurement may be performed.

Returning to FIG. 1A, in an embodiment, the control circuit 108 may be configured to estimate a power consumption of at least one of the processor and the memories based on one or more of the operating parameters. For example, a power consumption may be estimated from the operating parameters. In addition, the power consumption may be estimated from usage of the processor 104 and memories 106. In a particular example, a number of requests or activities over an interval may be counted. The operating parameters and other measurements of aspects of the system may be used individually or combined together to create a power measurement. In some embodiments, estimates of power consumption may be used for some devices of the system 100 while power meters similar to the power meter circuits 130 of FIG. 4 may be used in other devices. Regardless, the power measurements may be combined into a power consumption for a given iteration.

Figure 5:
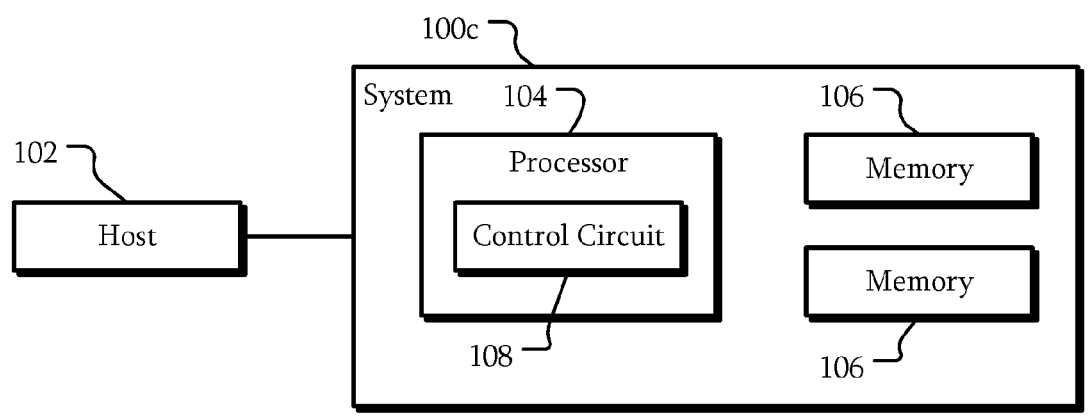
FIG. 5 is a schematic view of a system according to another embodiment.

FIG. 5 is a schematic view of a system according to another embodiment. In this embodiment, the control circuit 108 is part of the processor 104. For example, the operations of the control circuit 108 described above may be performed by a program executing on the processor 104. For example, the processor 104 may include one or more memory bus interfaces configured to enable the processor 104 to communicate with the memories 106. Through the memory bus interface the processor 104 may be configured to set operating parameters of the memories. In addition, the program executing on the processor 104 may access registers of the processor 104, access a power supply system for the processor 104 or the like to change the processor 104 operating parameters during an iteration.

Figure 6:
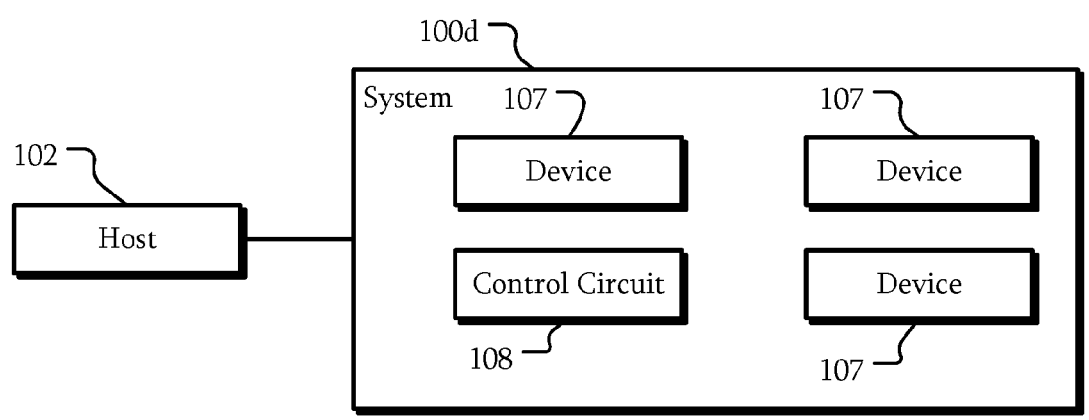
FIG. 6 is a schematic view of a system according to another embodiment.

FIG. 6 is a schematic view of a system according to another embodiment. In this embodiment, the system 100*d* is similar to the system 100 of FIG. 1A. However, in this embodiment, the system 100*d* includes multiple devices 107. Each of the devices 107 has one or more operating parameters that may be changed by the control circuit 108. The control circuit 108 may be configured to receive a power limit, measure a power consumption of the devices; and iteratively change the operating parameters of the devices to optimize an objective function associated with the system to operating states where the power consumption is less than or equal to the power limit. In other words, the optimization within a power limit described herein with respect to memories 106 may also be applied to generic devices provided that those devices have configurable operating parameters.

Figure 7:
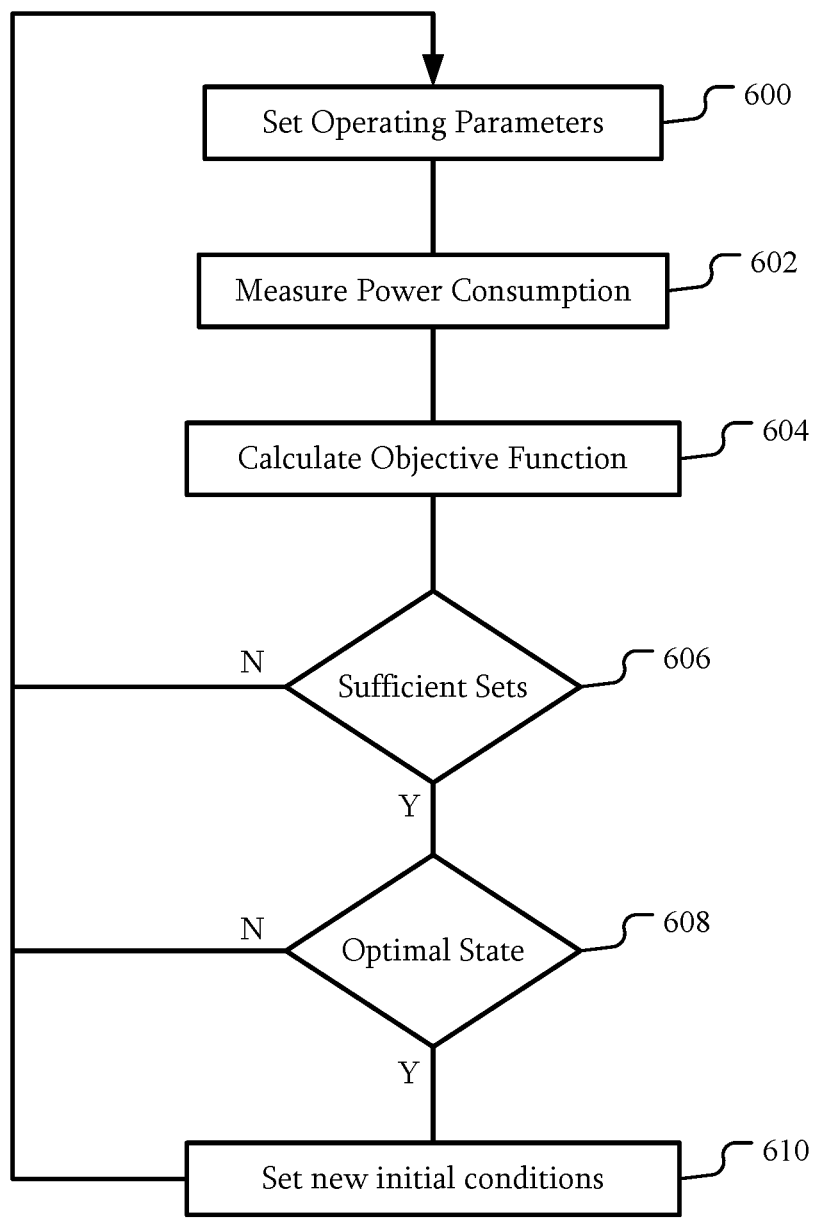
FIG. 7 is a flowchart of a technique of iterating according to an embodiment.

FIG. 7 is a flowchart of a technique of iterating according to an embodiment. Referring to FIGS. 1A, 1B, and 7, in this embodiment, in 602 operating parameters are set to a particular state. For example, the control circuit 108 may set the supply voltage for the processor 104, the number of ranks of a first memory 106, and a programming voltage of another memory 106. The control circuit 108 may be configured to communicate with one or more voltage regulators to set the various voltages and communicate with the first memory 106 to set the number of ranks.

In 602, the power consumption may be measured. For example, the control circuit 108 may communicate with the processor 104 and the memories 106 to read a power register, a temperature register, or the like. The control circuit 108 may then combine values from the processor 104 and the memories 106 into a power consumption measurement.

In 604, the objective function for the current state of operating parameters may be calculated. For example, the control circuit 108 may communicate with the processor 104 and the memories 106 to determine values that may contribute to the objective function. For example, the processor 104 may track read/write requests over time, a latency of such requests, or the like. The collection of data may be performed by the processor 104 and memories, performed by the control circuit, or performed by a combination of such components. Regardless, the control circuit 108 may obtain a value for the objective function.

In 606, the control circuit 108 determines if measurements for a sufficient number of sets of operating parameters have been made. If not, another set of operating parameters are selected and set in 600 and measurements are made in 602 and 604 as described above. For example, if the number of operating parameters being changed when using the Nelder-Mead method is 10, then the measurements may be repeated by the control circuit 108 for 11 sets of operating parameter states.

Once a sufficient number of sets have been measured, the control circuit may make a determination in 608 of an optimal state. For example, the control circuit 108 may determine if the iterations have converged to an optimal state. If not, a new iteration may be performed according the current iteration method to make measurements on one or more other sets of operating parameter states.

In 610, after an optimal set of operating parameter states has been identified, the operating parameters for initial sets for another optimization sequence of may be set. For example, the control circuit 108 may set one of the initial sets of operating parameter states to the states in the previous optimal set and set the other initial sets to random sets. The operating parameters may be iterated again, as described above.

Figure 8:
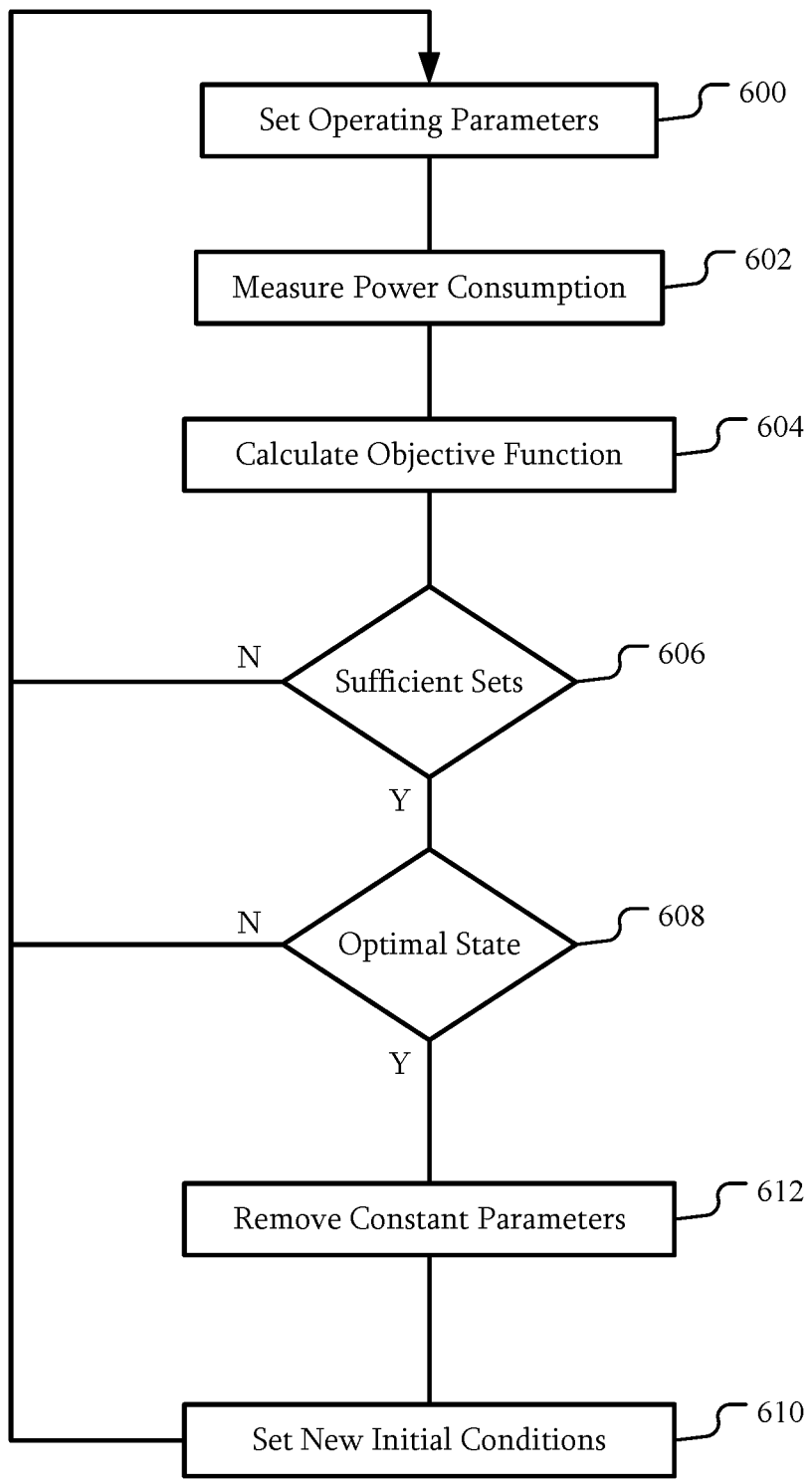
FIG. 8 is a flowchart of a technique of iterating according to an embodiment.

FIG. 8 is a flowchart of a technique of iterating according to an embodiment. Referring to FIGS. 1A, 1B, and 8, in this embodiment, the method may be similar to that of FIG. 7. However, after an optimal set of operating parameters has been found in 608, that set and previous optimal sets of operating parameters are analyzed to determine if one or more have remained constant a sufficient number of optimization sequences. If so, those parameters are removed from the set of operating parameters for future iterations in 612. For example, the control circuit 108 may mark the operating parameters to be removed as removed in a data structure stored in a memory of the control circuit 108. Iteration may continue in 608 as described above.

Returning to FIGS. 1A and 1B, in an embodiment, the system 100 may allow for new control mechanisms for the host 102. For example, the host 102 may change the power limit for the system 100. The host 102 may change the objective function of the device. System management software executing on the host 102 may execute a new system call or an extended system call to change such parameters of the system 100. As described above, the system 100 may receive commands related to these parameters. Through these system calls, the host 102 may generate the commands and send them to the system 100.

Figure 9:
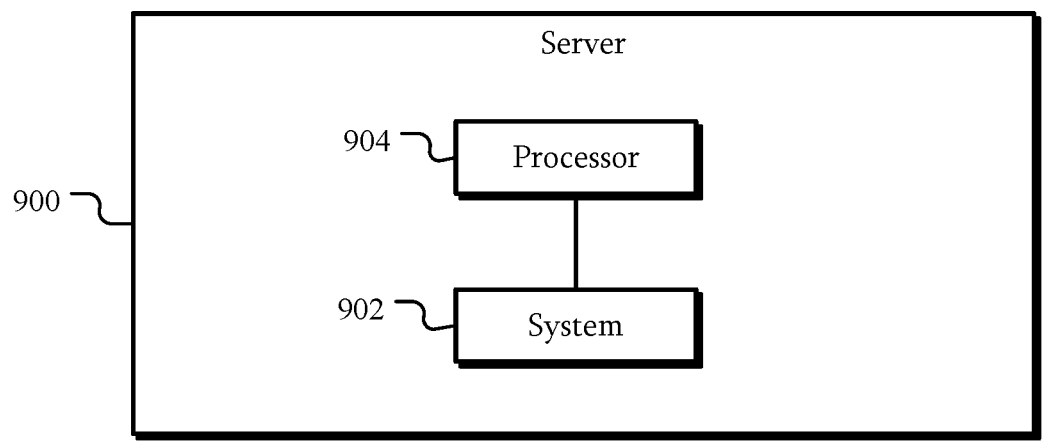
FIG. 9 is a schematic view of a server according to an embodiment.

FIG. 9 is a schematic view of a server according to an embodiment. In this embodiment, the server 900 may include a stand-alone server, a rack-mounted server, a blade server, or the like. The server 900 includes a system 902 and a processor 904. The processor 904 is coupled to the system 902. Although only one system 902 is illustrated, any number of systems 902 may be present. The system 902 may be any of the above described corresponding systems such as the systems 100, 100*a*, 100*b*, 100*c*, 100*d*, or the like. For example, the system 902 may be an SSD. The SSD may provide data storage for the server 900.

Figure 10:
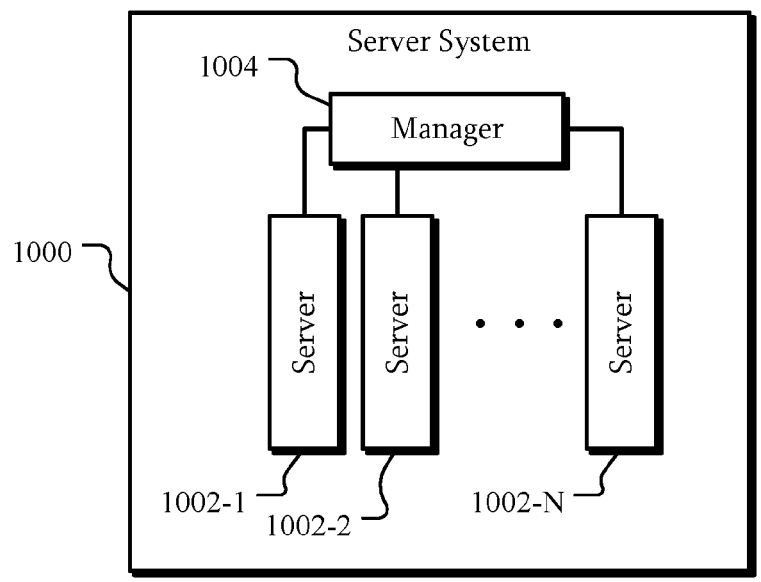
FIG. 10 is a schematic view of a server system according to an embodiment.

FIG. 10 is a schematic view of a server system according to an embodiment. In this embodiment, the server system 1000 includes multiple servers 1002-1 to 1002-N. The servers 1002 are each coupled to a manager 1004. One or more of the servers 1002 may be similar to the server 900 described above.

The manager 1004 is configured to manage the servers 1002 and other components of the server system 1000. In an embodiment, the manager 1004 may be configured to manage the power consumption of the servers 1002. For example, as each of the servers 1002 may include a system such as the systems 100, 100*a*, 100*b*, 100*c*, 100*d*, or the like described above, the manager 1004 may communicate with those systems to set power limits. In a particular example, the manager 1004 may have been configured by an administrator to reduce a power consumption of the server system 1000 but maintain a particular level of performance. With only a TDP of an SSD, the manager 1004 may only have an option of placing the systems of the servers 1002 in a sleep or other disabled state. However, with systems according to an embodiment, a finer granularity of power limits and operating states may be achieved. For example, the manager 1004 may communicate with a processor of the servers 1002 to send a command to the systems of the servers 1002 to set a power limit and set an objective function to optimize performance. As a result the systems of the server system 1000 may iteratively change operating parameters to optimize performance within the particular power limit set by the manager 1004.

Figure 11:
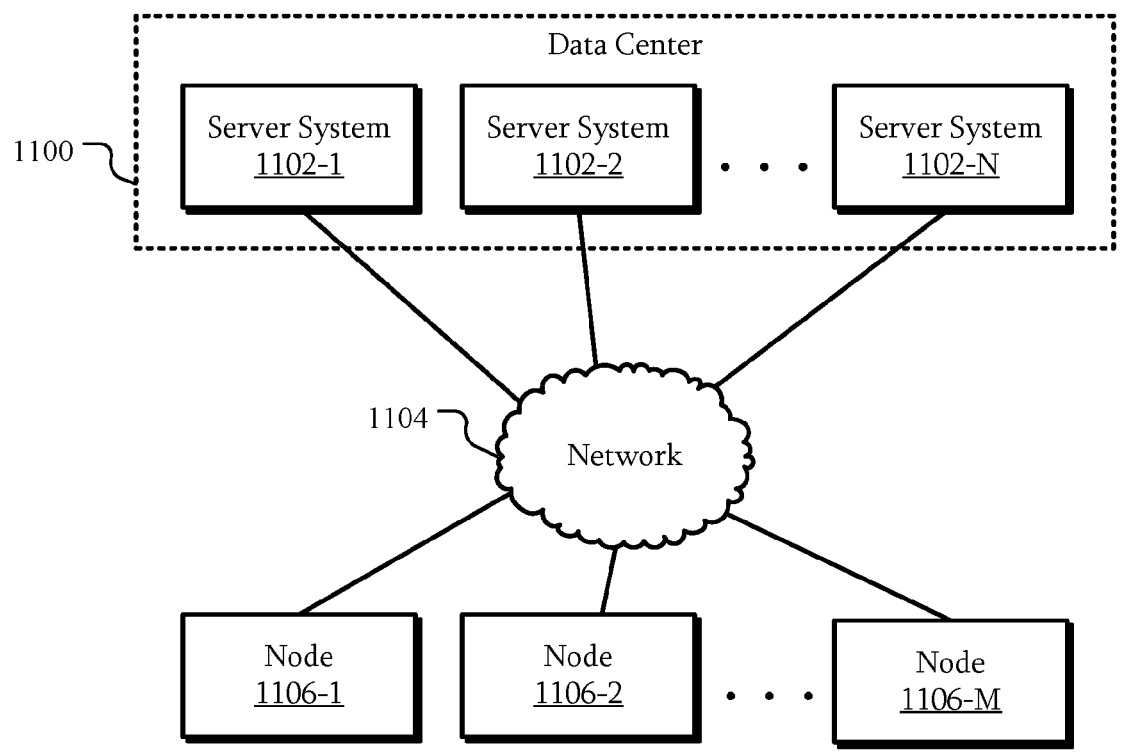
FIG. 11 is a schematic view of a data center according to an embodiment.

FIG. 11 is a schematic view of a data center according to an embodiment. In this embodiment, the data center 1100 includes multiple servers systems 1102-1 to 1102-N. The server systems 1102 may be similar to the server system 1000 described above in FIG. 10. The server systems 1102 are coupled to a network 1104, such as the Internet. Accordingly, the server systems 1102 may communicate through the network 1104 with various nodes 1106-1 to 1106-M. For example, the nodes 1106 may be client computers, other servers, remote data centers, storage systems, or the like.

Although the structures, methods, and systems have been described in accordance with particular embodiments, one of ordinary skill in the art will readily recognize that many variations to the disclosed embodiments are possible, and any variations should therefore be considered to be within the spirit and scope of the apparatus, method, and system disclosed herein. Accordingly, many modifications may be made by one of ordinary skill in the art without departing from the spirit and scope of the appended claims.

The invention claimed is:

1. A system, comprising:
a processor;
a plurality of memories; and
a control circuit coupled to the processor and the memories, and configured to:
receive a power limit;
measure a power consumption of the processor and the memories;
iteratively change a plurality of operating parameters of the processor and the memories to optimize an objective function associated with the system to operating states where the power consumption is less than or equal to the power limit, including:
operating the processor and memories using each of a plurality of sets of states of the operating parameters where the power consumption is less than or equal to the power limit; and
calculating a result of the objective function for each of the sets of the states of the operating parameters;
identify an operating parameter having a state that has remained constant among at least two consecutive optimization sequences; and
remove the identified operating parameter from the operating parameters for at least one future optimization sequence.

2. The system of claim 1, wherein the plurality of operating parameters of the processor and the memories comprise at least one operating parameter of the processor, at least one operating parameter of a first memory of the memories, and at least one operating parameter of a second memory of the memories.

3. The system of claim 1, wherein the memories comprise a dynamic random access memory (DRAM) and a non-volatile random access memory (NVRAM).

4. The system of claim 3, wherein the operating parameters comprise at least one of a power gating parameter, a self-refresh parameter, a number of ranks, and a number of channels of the DRAM.

5. The system of claim 3, wherein the operating parameters comprise at least one of a read retry parameter, a single-level/multi-level cell mode switch, an erase voltage, and a programming voltage of the NVRAM.

6. The system of claim 1, wherein the operating parameters comprise at least one of a dynamic voltage and frequency scaling (DVFS) parameter and a power gating parameter of the processor.

7. The system of claim 1, wherein at least one of the processor and the memories includes a power meter circuit configured to measure power.

8. The system of claim 1, wherein the control circuit is further configured to estimate a power consumption of at least one of the processor and the memories based on one or more of the operating parameters.

9. The system of claim 1, wherein the control circuit is further configured to:
receive a second power limit; and
iteratively change the operating parameters of the processor and the memories to optimize the objective function associated with the system to operating states where the power consumption is less than or equal to the second power limit.

10. The system of claim 1, wherein processor includes the control circuit.

11. A method, comprising:
receiving a power limit in a control circuit;
measuring, by a control circuit, a power consumption of a processor and a plurality of memories; and
iteratively changing, by the control circuit, a plurality of operating parameters of the processor and the memories to optimize an objective function associated with the processor and memories to operating states where the power consumption is less than or equal to the power limit, including:
operating the processor and memories using each of a plurality of sets of states of the operating parameters where the power consumption is less than or equal to the power limit;
calculating a result of the objective function for each of the sets of the states of the operating parameters;
identifying, by the control circuit, an operating parameter having a state that has remained constant among at least two consecutive optimization sequences; and
removing, by the control circuit, the identified operating parameter from the operating parameters for at least one future optimization sequence.

12. The method of claim 11, wherein the memories comprise a dynamic random access memory (DRAM) and a non-volatile random access memory (NVRAM).

13. The method of claim 11, further comprising:
receiving, by the control circuit, a second power limit; and
iteratively changing, by the control circuit, the operating parameters of the processor and the memories to optimize the objective function associated with the processor and memories to operating states where the power consumption is less than or equal to the second power limit.

14. The method of claim 11, further comprising receiving a command indicating at least one of an iterative method to use when iteratively changing the operating parameters, the objective function, and the power limit.

15. The method of claim 11, wherein iteratively changing, by the control circuit, the operating parameters comprises iteratively changing, by the control circuit, the operating parameters according to at least one of a Nelder-Mead method and a coordinate descent method.

16. The method of claim 15, further comprising initializing, by the control circuit, an iteration of the operating parameters with a plurality of sets of previous optimized operating states.

17. The method of claim 15, further comprising initializing, by the control circuit, an iteration of the operating parameters with a random set of operating states.

18. A system, comprising:
- a plurality of devices; and
- a control circuit coupled to the devices, and configured to:
    - receive a power limit;
    - measure a power consumption of the devices;
    - iteratively change a plurality of operating parameters of the devices to optimize an objective function associated with the system to operating states where the power consumption is less than or equal to the power limit, including:
        - operating the devices using each of a plurality of sets of states of the operating parameters where the power consumption is less than or equal to the power limit; and
        - calculating a result of the objective function for each of the sets of the states of the operating parameters;
    - identify an operating parameter having a state that has remained constant among at least two consecutive optimization sequences; and
    - remove the identified operating parameter from the operating parameters for at least one future optimization sequence.

* * * * *